United States Patent
Bushmitch et al.

(10) Patent No.: US 7,020,823 B2
(45) Date of Patent: Mar. 28, 2006

(54) ERROR RESILIENT CODING, STORAGE, AND TRANSMISSION OF DIGITAL MULTIMEDIA DATA

(75) Inventors: Dennis Bushmitch, Somerset, NJ (US); Wanrong Lin, Plainsboro, NJ (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 598 days.

(21) Appl. No.: 10/101,073

(22) Filed: Mar. 19, 2002

(65) Prior Publication Data

US 2003/0182610 A1    Sep. 25, 2003

(51) Int. Cl.
*H03M 13/00* (2006.01)

(52) U.S. Cl. .................................. 714/752
(58) Field of Classification Search ............. 714/752, 714/746, 786; 375/240.27
See application file for complete search history.

(56) References Cited

U.S. PATENT DOCUMENTS

| | | | | |
|---|---|---|---|---|
| 5,412,667 A | | 5/1995 | Havemose | 375/240.27 |
| 5,928,331 A | * | 7/1999 | Bushmitch | 709/231 |
| 6,104,757 A | | 8/2000 | Rhee | 375/240.12 |
| 6,317,462 B1 | | 11/2001 | Boyce | 714/756 |

OTHER PUBLICATIONS

Cai et al., Use of pre-interleaving for video streaming over wireless access networks, 2001, IEEE, p. 934-937.*
Vass et al., Video streaming for wireless ATM networks, 2000, IEEE, p. 1301-1304.*
Jianfei Cai and Chang Wen Chen; "Video Streaming: An FEC-Based Novel Approach".

* cited by examiner

*Primary Examiner*—Shelly Chase
(74) *Attorney, Agent, or Firm*—RatnerPrestia

(57) ABSTRACT

Error resilient methods and apparatus for coding, transmitting and/or storing digital multimedia data are disclosed. Digital multimedia data is organized into channel blocks, which include columns of data. A priority is determined for each channel block, based on the data within the channel block. Different forward error correction (FEC) procedures may be selected for the channel blocks based on their priority. Also, channel blocks may be transmitted on different transmission channels, and/or stored on different storage elements, based on their priority. Also disclosed is the coding, as pre-interleaved channel blocks, of digital multimedia data having fixed-length segments. The fixed-length segments are ordered and arranged in pre-interleaved channel blocks containing rows and columns. Pre-interleaving of a channel block arranges consecutive fixed-length segments along its columns. FEC data is determined for each row and included in the channel block. The channel blocks are packetized along the columns.

32 Claims, 5 Drawing Sheets

ERROR RESILIENT CODING, STORAGE, AND TRANSMISSION OF DIGITAL MULTIMEDIA DATA

BACKGROUND OF THE INVENTION

The present invention relates generally to the coding of digital multimedia data. More particularly, the invention relates to error resilient coding of digital multimedia data for maintaining signal quality in a noisy system, or overcoming data loss without re-transmission.

Digital multimedia data may be coded in either variable-length segments, such as MPEG data or in fixed-length segments, such as digital video (DV) data. Digital multimedia data coded in fixed-length segments, however, may include both: digital multimedia data coded using fixed-length coding techniques; and digital multimedia data coded using variable-length coding techniques, such as run length coding, in fixed-length segments.

With the explosive growth of the Internet, there is a growing interest in using the Internet and other Internet protocol-based networks to deliver multimedia selections, such as video and audio material. Interactive television, movies on demand, and other multimedia push technologies are among the more promising applications.

The Internet is a connectionless network offering best effort delivery service. Packets of data are routed as datagrams that carry the address of the intended recipient. A specific connection between the sender and the recipient is not required, because all host nodes on the network include the inherent capability to route datagrams from node to node until delivery is effected. This packet delivery scheme is constructed as a best effort delivery system in which the delivery of packets is not guaranteed. Additionally, certain transmission channels through such a network may have higher channel quality and thus inherently lose fewer packets. Higher quality channels are often more expense to use and may be under greater demand, both of which may effect the desirability of using such channels. These facts significantly affect how certain multimedia data are delivered.

A number of schemes have been designed to deal with the difficulties of transmitting multimedia data arising from possible the loss of packets during transmission. One such scheme is described in U.S. Pat. No. 5,928,331 to Bushmitch. In this scheme, the video data is coded using a non-hierarchical coding technique in which the data are capable of being reconstituted from fewer than all of the components of the original data stream. Image quality is dependent on the number of components used for the reconstitution.

Another method involves the retransmission of lost packets. Re-transmission has usually been the method of choice for dealing with lost packets of digital multimedia data coded in fixed-length segments. The client receiving the data requests the re-transmission of any packets which do not arrive within a reasonable time frame. The arrival of the re-transmitted data is also not guaranteed, which may require further re-transmission. For video data, this method may lead to significant time lags in viewing the images and possible choppiness for streaming video applications. The eventual image quality is maintained, though, due to the availability of all original data for reconstitution and decoding.

Error concealment and error correction methods have also been used to repair audio and video data with missing packets. These methods are often used in conjunction, with errors being corrected if possible and concealed if correction is not possible. Also, error concealment and error correction methods have proven useful for recovering data which has been corrupted during storage, such as data from a CD or DVD which contains a scratch or other defect, or due to noise during transmission. Error concealment methods fill in missing data in a file with replacement data. Replacement data may be zeroes or may be determined by interpolating nearby data to obtain values. For video data, the use of zeroes for replacement data may lead to a section of black pixels in an image, while interpolation may lower the resolution of the image by smearing the area containing the error. Error correction involves the inclusion of additional data, along with the original data, which may allow the detection and possible recovery of missing or corrupted data. Error correction increases the amount of data and may increase necessary decoding time or resources, but it allows for a certain degree of data loss or corruption while maintaining image quality.

A common form of error correction that has been used with MPEG data is forward error correction (FEC). In traditional FEC coding the original data is thought of as being organized into channel blocks, as shown in FIG. 1. Channel block 100 is a matrix of rows 102 and columns 106 with the data organized in successive rows of a set length. An FEC formula, such as a Reed-Solomon code, is applied to each row to generate FEC data 104 for that row. As shown, FEC data 104 is arranged as a column at the end of each row. The data is then separated into columns so that it may be stored or transmitted. Each column represents one transmission packet. By applying the FEC formula in a direction orthogonal to the packetization the FEC method may allow for the recovery of lost packets as well as correction of errors due to noise or data corruption (unless more than a certain number of packets are lost). When this interleaving scheme is applied to block-based video data such as DV data, unrecoverable packet losses (when the FEC is not strong enough) may cause many video blocks to become undecodable.

In Video Streaming: An FEC-Based Novel Approach, Cai and Chen disclose an alternative method of forming the channel block for FEC coding of MPEG-4 video data, known as pre-interleaving. As shown in FIG. 2, data is arranged in consecutive columns 202 of channel block 200 rather than along rows 204 as illustrated in FIG. 1. The data is still separated into columns for storage or transmission, i.e. packetization remains orthogonal to the FEC coding, but the pre-interleaved data is now aligned with the packetization. This means that each packet contains consecutive data. Pre-interleaving is used in this method due to the variable length coding of the data. Therefore, any non-correctable errors due to a lost or corrupted packet will be grouped in the MPEG-4 video image. This grouping of non-correctable errors may improve error concealment for MPEG-4 video data.

SUMMARY OF THE INVENTION

The present invention is embodied in an exemplary method of coding digital multimedia data, which includes a plurality of fixed-length segments, as channel blocks. The first step of this exemplary method is to order the fixed-length segments. This order may be pseudo-random or may be based on a priority given to the fixed-length segments. A predetermined number of consecutive fixed-length segments are selected from the beginning of the ordered set of fixed-length segments to form a first channel block of digital multimedia data. Subsequent fixed-length segments are similarly selected to form further channel blocks. The ordered fixed-length segments selected for a given channel block are then arranged as a pre-interleaved matrix of rows and columns. This pre-interleaving aligns a set number of consecutive fixed-length segments down each column of the matrix in turn from the upper left hand corner of the matrix to the lower right hand corner. Forward error correction (FEC) data is then determined for each row of the channel block. This FEC data is added to the channel block matrix as at least one additional column. Each channel block is separated into a plurality of packets, each packet including one column of data of the channel block. These packets may be transmitted over a transmission channel or may be stored in a storage medium for later use.

Another exemplary embodiment of the present invention is a method of coding digital multimedia data with FEC, using a plurality of FEC procedures. The digital multimedia data is organized into a plurality of channel blocks, each of these channel blocks including a plurality of columns of data. A priority is determined for each channel block. This priority is based on the digital multimedia data which makes up the channel block. Then, based on the priority assigned to a channel block, one of the FEC procedures is selected for that channel block. Generally, a higher priority channel block will receive an FEC procedure which has a greater strength. The selected FEC procedure is then used to determine the FEC data for the channel block and this FEC data is added to the channel block as one or more additional columns. The channel block is then separated into a plurality of packets, each packet including a column of the channel block.

A further exemplary embodiment of the present invention is a method of transmitting digital multimedia data using a plurality of transmission channels. The digital multimedia data is organized into a plurality of channel blocks, each of these channel blocks including a plurality of columns of data. A priority is determined for each channel block. This priority is based on the digital multimedia data which makes up the channel block. Then, based on the priority assigned to a channel block one of the plurality of transmission channels is selected for that channel block. Generally, a higher priority channel block will receive a transmission channel with higher channel quality. The channel block is then transmitted along the selected transmission channel as a plurality of packets. Each packet includes one column of the channel block.

A still further exemplary embodiment of the present invention is a method of storing digital multimedia data using a plurality of storage elements. The digital multimedia data is organized into a plurality of channel blocks, each of these channel blocks including a plurality of columns of data. A priority is determined for each channel block. This priority is based on the digital multimedia data which makes up the channel block. Then, based on the priority assigned to a channel block one of the plurality of storage elements is selected for that channel block. Generally, a higher priority channel block will receive a storage element with higher storage quality. The channel block is then stored on the selected storage element as a plurality of packets. Each packet includes one column of the channel block.

Yet another exemplary embodiment of the present invention is an error-resilient digital multimedia data coding apparatus. The exemplary apparatus includes: a block forming buffer; prioritizing means; a plurality of calculating means; and selection means. The block forming buffer organizes digital multimedia into a plurality of channel blocks. Each channel block includes a plurality of columns of digital multimedia data and at least one column of FEC data. The prioritizing means determine a priority for a channel block based on the digital multimedia data within the channel block. The calculating means are used to determine FEC data for a channel block. The selection means selects one of calculating means is to be used for a given channel block based on the priority of that channel block. The FEC data for higher priority channel blocks is calculated using calculating means which have a stronger FEC coding, either through a different formula or through a larger number of bits of FEC data calculated. Any one of the prioritizing means, the calculating means, or the selection means may be provided as special purpose circuitry, or may be accomplished within a program on a general purpose computing device.

Another exemplary embodiment of the present invention is an error-resilient digital multimedia data transmission apparatus, which includes a digital multimedia data coding section and a plurality of transmission channels. The digital multimedia data coding section includes a block forming buffer to organize digital multimedia data into a plurality of channel blocks and prioritizing means to determine a priority of a channel block based on the digital multimedia data coded within the channel block. Each channel block includes a plurality of columns of digital multimedia data. Which transmission channel a channel block of digital multimedia data is transmitted on is determined based on the priority of the channel block. Higher priority channel blocks are generally transmitted on higher quality transmission channels.

A further exemplary embodiment of the present invention is an error-resilient digital multimedia data storage system, which includes a digital multimedia data coding section and a plurality of storage elements. The digital multimedia data coding section includes a block forming buffer to organize digital multimedia data into a plurality of channel blocks and prioritizing means to determine a priority of a channel block based on the digital multimedia data within the channel block. Each channel block includes a plurality of columns of digital multimedia data. Which storage element a channel block of digital multimedia data is stored on is determined based on the priority of the channel block. Higher priority channel blocks are generally stored on higher quality storage elements.

DETAILED DESCRIPTION OF THE INVENTION

Digital video (DV) data is coded, using variable-length coding techniques, in fixed-length segments, DV segments. Although the invention is described in terms of DV data, it is contemplated that it may be practiced with any digital multimedia data that is DV, as it is used in this description, includes any digital multimedia data having a fixed block length.

Figure 3:
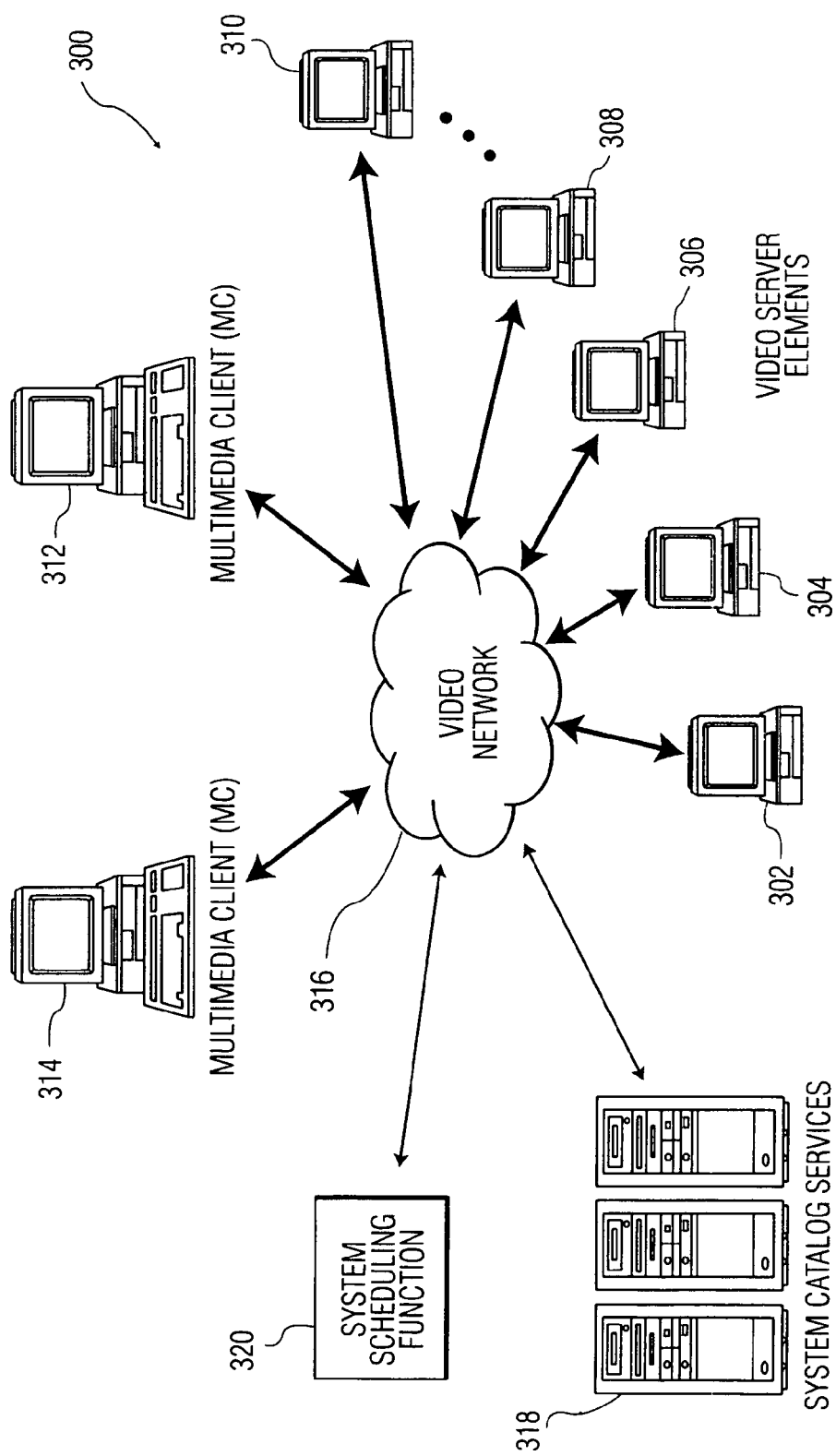
FIG. 3 is a schematic drawing of a distributed media server system.

FIG. 3 illustrates a typical distributed media server system 300. Multiple server elements 302, 304, 306, 308, and 310 are used to help alleviate bandwidth limitations and bottlenecks associated with a single server element. System 300 allows multiple clients 312 and 314 to access to access multimedia content of the entire system. It is noted that, although FIG. 3 illustrates a system with five server elements 302, 304, 306, 308, and 310 and two clients 312 and 314, these numbers are only exemplary.

In order for the entire media collection to be available to all clients, while still ensuring an efficient load across the various server elements, data, such as video data, is stored on storage elements of a plurality of the distributed server elements and/or transmitted over a number of transmission channels through network 316. These various server elements (or the storage elements within them) and transmission channels may provide different qualities of service. Some server elements or transmission channels may have greater noise or greater rates of packet loss associated with their use. Different types of storage elements, such as static or dynamic memories, hard disks, and removable tape or disk media, also may have different qualities of service, even those within a single server element. Generally, higher quality server and storage elements and transmission channels having a higher channel quality may be more expensive to use. This may be particularly true when the use of server elements, storage elements, and/or transmission channels is leased on a volume of use basis. Therefore, efficient use of these, and other, system resources may be more complicated than merely ensuring balanced usage, yet efficiency remains quite desirable.

Data striping may be used to eliminate reduplication of data storage by spreading blocks a given media stream across storage elements of several server elements. Storage and subsequent access may be accomplished via random, round robin, or group striping. Similarly, a media stream, such as the video data of a single file, may be transmitted in packets over several transmission channels to improve the distribution of traffic within network 316. Reference pointers to locate the storage of data blocks within system 300 are kept by system catalog services 318. Scheduling of block transmission through the network is monitored by system scheduling function 320 to desirably ensure that the server elements, storage elements, and transmission channels are utilized in an efficient manner.

Figure 4:
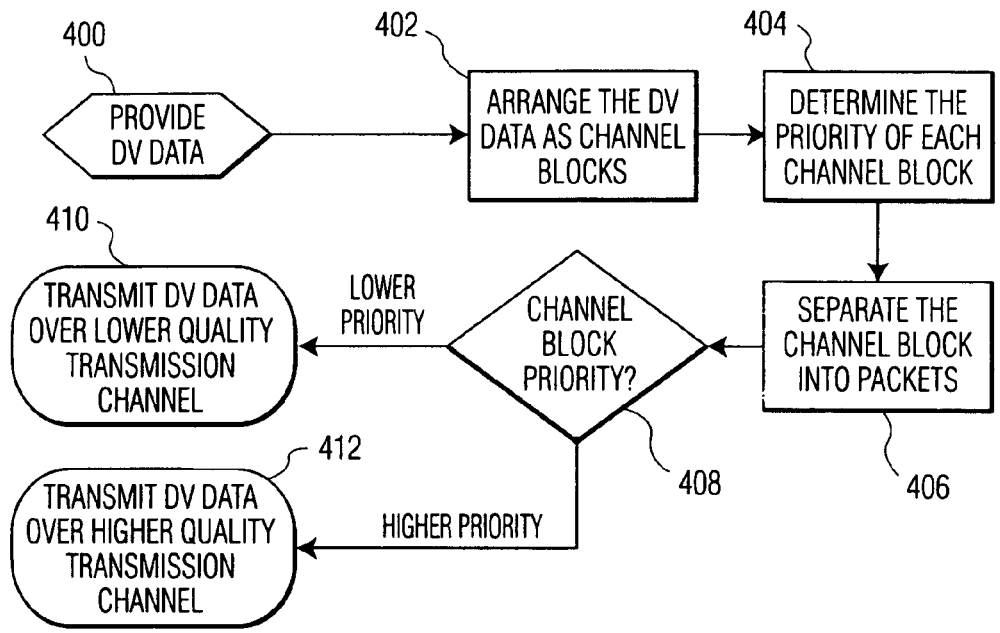
FIG. 4 is a flowchart illustrating an exemplary video data transmission method.

Re-transmission of lost packets leads to additional complications for system scheduling function 320. Therefore, limiting re-transmission is desirable. FIG. 4 illustrates an exemplary method to reduce retransmission for DV data over a network with different channel qualities for different transmission channels. This method is also contemplated for use with other block-based video data and in a network having a variety of channel qualities.

Figure 2:
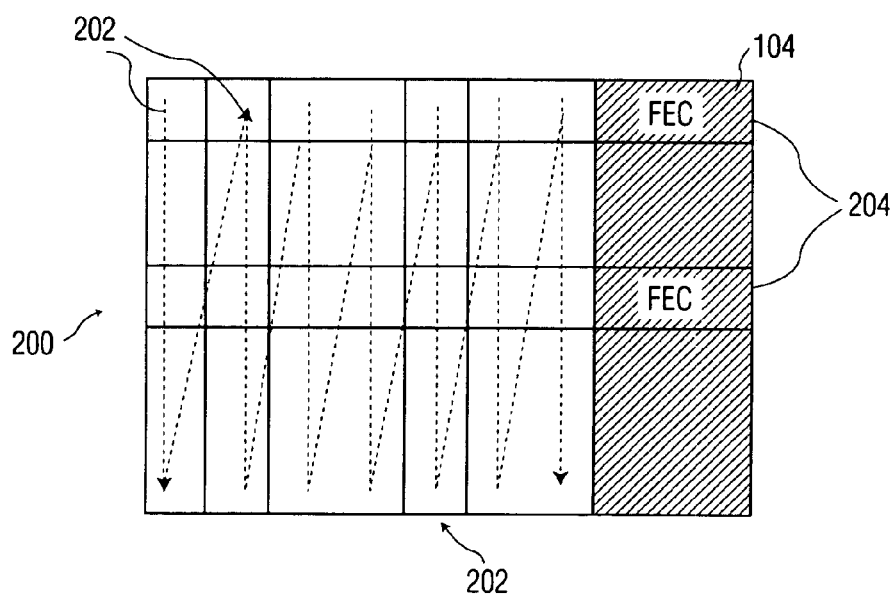
FIG. 2 is a schematic drawing of a pre-interleaved channel block formed with FEC.
Figure 5:
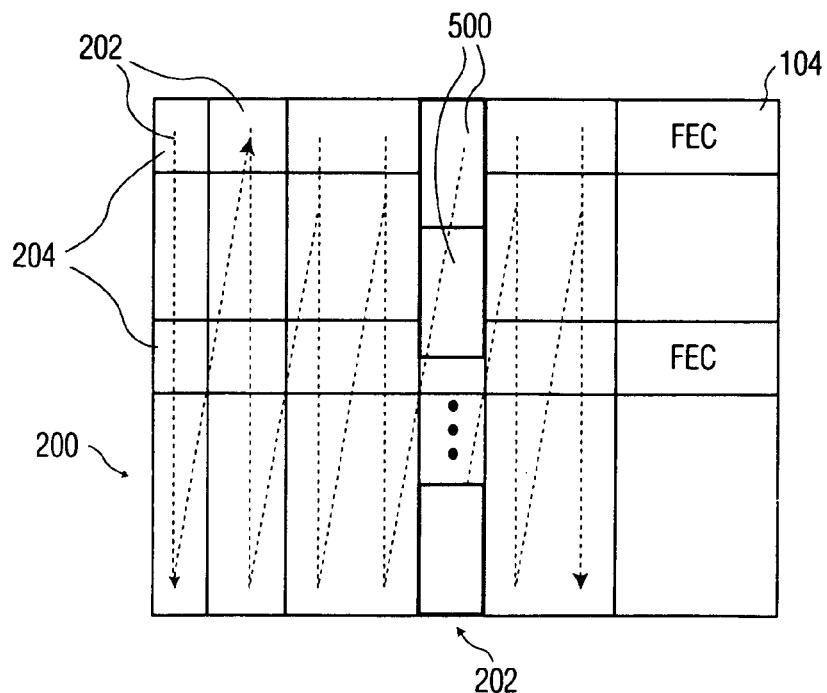
FIG. 5 is a schematic drawing of a pre-interleaved video channel block formed with FEC.
Figure 6:
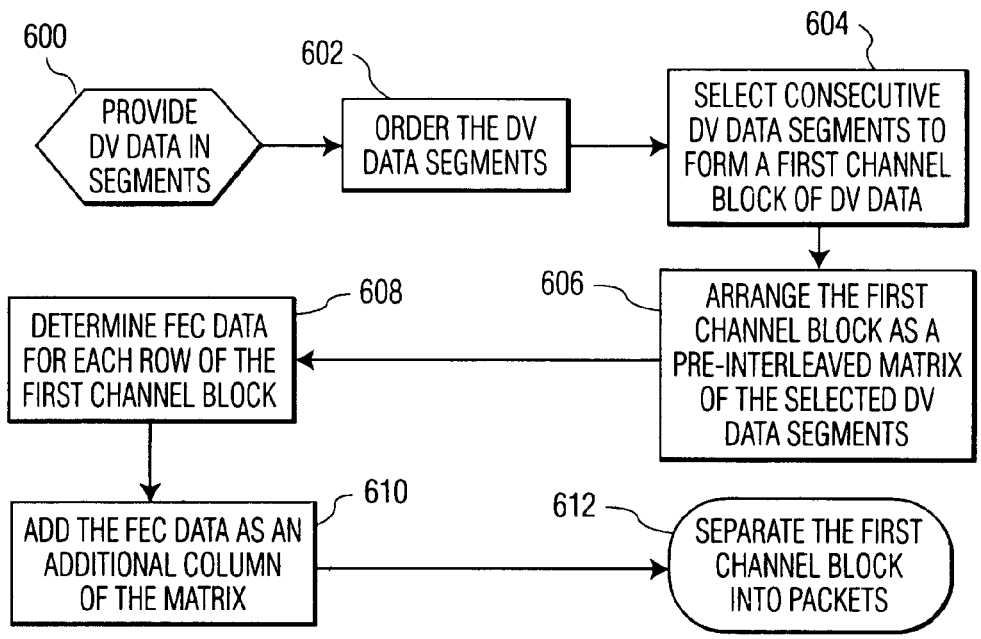
FIG. 6 is a flowchart illustrating an exemplary video data coding method.

DV data is provided in step 400. This data, which has previously been coded into DV segments, is arranged into channel blocks in step 402. FIG. 5 is a schematic drawing which illustrates an exemplary channel block arrangement in which DV segments 500 have been arranged within the matrix of channel block 200 along columns 202 in a manner similar to FIG. 2, and FIG. 6 provides a flowchart for an exemplary method to arrange DV segments into channel block 200 of FIG. 5. FIGS. 5 and 6 also describe the inclusion of FEC data 104 within channel block 200. FEC data may desirably be added for additional protection of the DV data against of data loss, but this is not a necessary element of the exemplary method of FIG. 4.

At step 404 the DV data in each channel block is analyzed to determine a priority for the channel block. A number of different criteria may be used to determine these priorities. Generally, the DV segments within the channel block are analyzed and the channel block priority is then determined as a weighted average of the priorities of the DV segments. One criteria may be the ease with which error correction may be performed if a DV segment is undecodable either due to noise or the loss of a packet containing the DV segment. Another criterion may be a measure of the difference between the channel block and a substitute channel block that would be produced if error concealment were necessary. Other priority criteria may be based on the discrete cosine transform (DCT) content of the DV segments. Choosing a particular function of the DCT coefficient allows significant latitude in determining which types of DV segments are to be assigned a high priority. Assigning higher priorities to DV segments with greater high frequency DCT content is a criteria which may be particularly desirable. Equation (1) illustrates an example of such a criterion.

$$A = \sum_{i=1}^{5} \sum_{j=1}^{4} \sum_{l=1}^{63} |C_{i,j}(l)| * l \qquad (1)$$

In equation (1), the parameter i specifies a DV macroblock within a DV segment, the parameter j specified a DCT block within a DV macroblock and the parameter l specifies the DCT order. The $C_{i,j}(l)$ are the particular DCT coefficients. The resulting parameter A represents the priority of the DV segment.

After their priorities have been determined the channel blocks are separated into packets, step 406. The packetization is performed along the columns (elements 202 in FIG. 5) of the channel block matrix. This is followed by selecting a transmission channel for each channel block to be transmitted on, step 408. This selection is based on the priorities determined in step 404. The channel block priority may be judged against predetermined standards or may be based on a ranking within a set granularity of data, such as a frame of DV data. Judging the channel blocks against a predetermined standard means that channel blocks of a given importance is always transmitted on a transmission channel of a given quality, but this may lead to inconsistent usage of network resources. Ranking the channel blocks within a set granularity allows for a consistent usage of network resources, but may cause under-, or over-utilization of some resources.

If the channel block is found to have a lower priority in step 408, then the packets of the channel block are transmitted along a lower quality transmission channel, step 410, but if the channel block is found to have a higher priority in step 408, then the packets of the channel block are transmitted along a higher quality transmission channel, step 412. As described above, this method may be extended to networks in which there are more than two channel qualities of transmission channels. The exemplary method of FIG. 4 may allow for more efficient utilization of multiple transmission channels having a variety of channel qualities within a distributed media server system similar to that illustrated in FIG. 3.

FIG. 6 is a flowchart illustrating an exemplary method of providing additional error resilience for DV data coded into channel blocks, using FEC. Although FIG. 6 illustrates the exemplary method only in terms of a single, first channel block. This representation does not imply a restriction of the present invention, but is merely for ease of presentation. It is noted that video files may desirably be larger than a single channel block and that this method is not restricted to the construction of a single channel block.

This exemplary method, known as pre-interleaving, has components that are similar to the method used on MPEG-4 data by Cai and Chen, which was illustrated in FIG. 2. FIG. 5, illustrates exemplary channel block 200 including pre-interleaved DV segments 500. The exemplary method of FIG. 6 begins with the DV data organized into DV segments, step 600. The DV segments are then ordered, step 602. The ordering is performed on a certain granularity of data, for example over the data of a frame or set number of frames. The order of the DV segments is desirably from highest priority to lowest priority (or lowest to highest) based on a priority ranking of the DV segments. The prioritization scheme may involve any of the methods described previously with regard to FIG. 4. Such ordering tends to increase the distinction between the priorities of the resulting channel blocks. Alternatively, the DV segments may be ordered by location within the total data set being ordered, in a pseudo-random fashion, or any other desired order.

Figure 1:
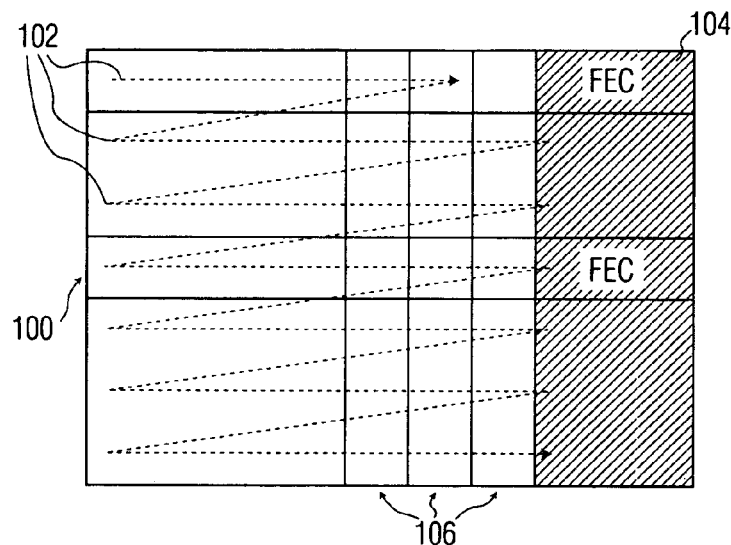
FIG. 1 is a schematic drawing of channel block formed with FEC.

Once the DV segments are ordered a first set of consecutive DV segments is selected for the first channel block of DV data, a second set is selected for a second channel block, and so forth, step 604. The number of DV segments in each set is typically 100–300, but other numbers may selected based on convenience. In step 606, selected and ordered DV segments 500 are desirably arranged in consecutive columns 202 of channel block 200 to form a pre-interleaved matrix, as illustrated in FIG. 5. It is noted that, although this exemplary method is illustrated with the DV segments organized into a channel block as a pre-interleaved matrix, other channel block organization schemes may be employed instead, such as an interleaved matrix similar to channel block 100 illustrated in FIG. 1.

Forward error correction (FEC) data is determined for each row of the channel block in step 608. The FEC data may be determined using any of a number of formulae, such as various Reed-Solomon codes and others. The number of bits of FEC data determined for each row is also chosen depending on the strength of FEC protection desired. The strength of the FEC procedure used is affected both by the type and hence, computational requirements, of FEC formula selected and the number of bits of FEC data per row chosen. Generally, it is preferable to use the same FEC procedure for each row of a given channel block, but it may be desirable to use different FEC procedures for different channel blocks, as described below with regard to the exemplary method of FIG. 7.

The FEC data determined in step 608 is next added to the channel block matrix as an additional column or columns in step 610. FIG. 5 illustrates one column of FEC data 104 on the right hand side of channel block 200. This exemplary organization is traditional for FEC data within a channel block matrix, but it is noted that the FEC data column may be place on the left or elsewhere within the channel block matrix if desired. A header row is typically added to the matrix as well including data such as: identification of the channel block; the coding method used; identification of the DV segments contained within the channel block; and possibly information regarding the FEC procedure used.

Each completed channel block is separated into a plurality of packets in step 612, each packet including one column of data of the channel block. These packets may be transmitted over a transmission channel or may be stored in a storage element for later use. The packetization is orthogonal to the FEC coding. Thus, the recovery of lost packets as well as correction of errors due to noise or data corruption may be more readily accomplished. Also, the pre-interleaved data is now aligned with the packetization. This means that each packet contains complete DV segments. Therefore, any non-correctable errors due to a lost or corrupted packet will lead to the complete loss of those DV segments, but this may be preferable to scattering the loss over a larger number of DV segments as could happen without pre-interleaving of the DV segments. This grouping of non-correctable errors may also improve error concealment for DV data.

Figure 7:
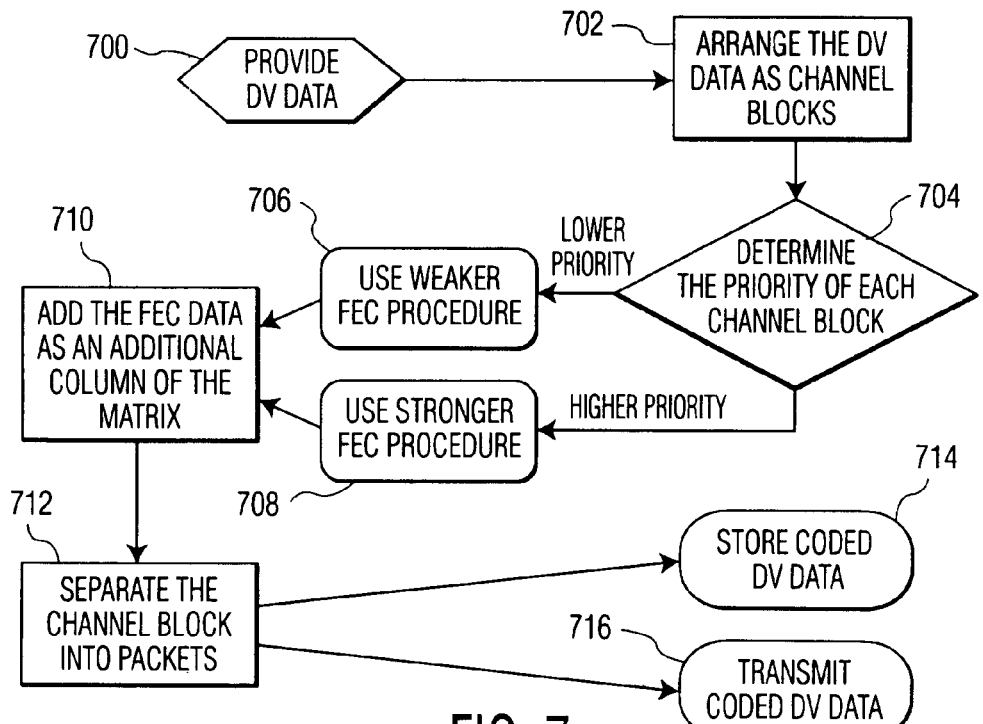
FIG. 7 is a flowchart illustrating an exemplary video data coding method.

FIG. 7 illustrates an alternative exemplary embodiment of the DV data coding method of FIG. 6. As in FIG. 4, this exemplary method includes two priorities for the channel blocks. This number is chosen merely for illustrative purposes, it is contemplated that larger numbers priorities may be desirable. First, DV data is provided, step 700, and arranged in channel blocks, step 702. The DV data may be provided as DV segments as in the method of FIG. 6, but this is not necessary. The channel block may be arranged as either a pre-interleaved or an interleaved matrix. Once the channel blocks are arranged, the priority of each channel block is determined in step 704. The priority of the channel blocks is based on the priority of the DV data making up the channel. These priorities may be determined by methods similar to those suggested above with regard to the exemplary method of FIG. 4.

Those channel blocks having lower priority are processed in step 706 where an FEC procedure with a lower strength is used to determine FEC data for the lower priority channel blocks. Meanwhile, the channel blocks having a higher priority are processed in step 708 and a stronger FEC procedure is used. As described above with respect to the exemplary method FIG. 6, the strength of an FEC code may depend on the formula selected or the number of bits of FEC data determined by the code, or both. The use of different FEC formulae may add to the computational complexity to decode the DV data and may cause some channel blocks to take longer to decode than others, but this approach may also allow for consistency in channel block size, which may prove advantageous. The use of differing numbers of bits of FEC data may cause channel block, and possibly packet size to vary, but may simplify the decoding of the DV data. In the exemplary method of FIG. 7, choice of varying the FEC formula, the number of bits of FEC data, or both used depends on which advantages are desired.

Once the FEC data has been determined, it is added as a column to the channel block matrix, step 710, as in the exemplary method of FIG. 6. A row of header information is also preferably added. The channel block is separated into packets, step 712, which may be stored for later use, step 714, or transmitted over a transmission channel, step 716.

Figure 8:
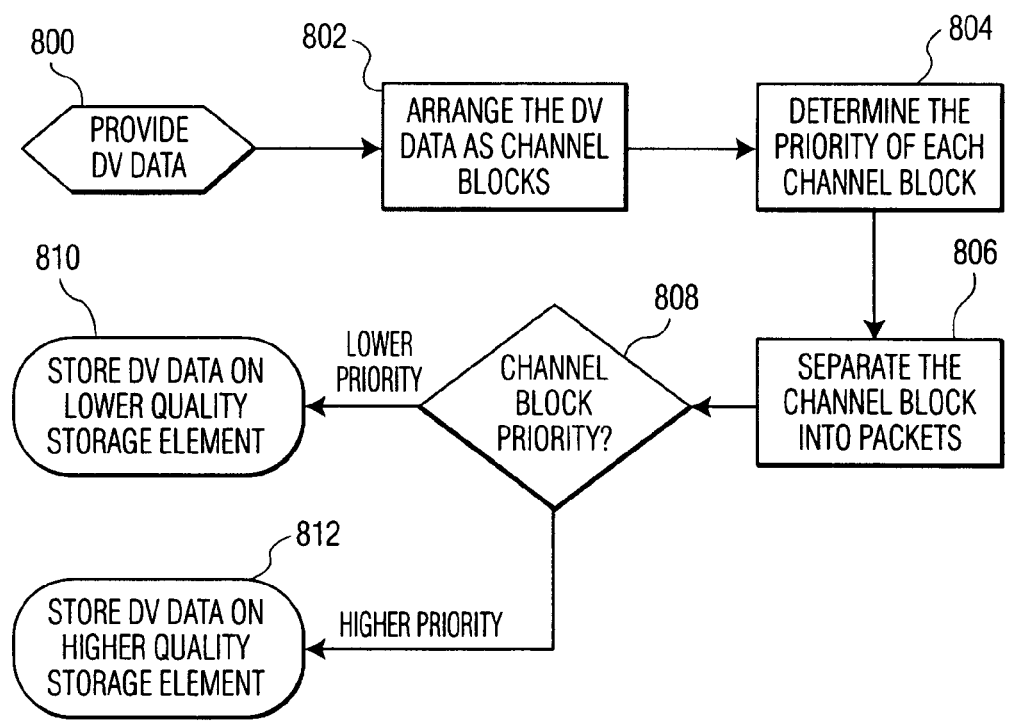
FIG. 8 is a flowchart illustrating an exemplary video data storage method.

FIG. 8 illustrates an exemplary method of storing DV data according to the present invention. This method is similar to the exemplary method illustrated in FIG. 4 for transmitted DV data, including the exemplary selection only two priority categories for channel blocks in these examples. Steps 800, 802, 804, and 806 of FIG. 8 are identical to steps 400, 402, 404, and 406 of FIG. 4. The difference between these exemplary methods begins at step 808. In the exemplary method of FIG. 8, channel block priorities are judged at step 808 and channel blocks having lower priorities are sent to lower quality storage elements in the system to be stored. Channel blocks in the higher priority category are stored on higher quality storage elements. Because only data of a lower priority is likely to be lost, verification, and possible retransmission of the stored DV data may be unnecessary. This exemplary method should allow for more efficient usage of system resource while maintaining the quality of the DV data. Additional safeguards may be utilized, such as the inclusion of FEC data within the channel blocks as previously described with regard to FIGS. 6, and 7.

Additionally, it is contemplated that the methods previously described may be carried out within a general purpose computer system instructed to perform these functions by means of a computer-readable medium. Such computer-readable media include; integrated circuits, magnetic and optical storage media, as well as audio-frequency, radio frequency, and optical carrier waves.

Although the embodiments of the invention described above have been in terms of exemplary DV coding, transmission and storage in distributed media server systems, it is contemplated that similar concepts may be practiced with other media server systems. Also, it will be understood to one skilled in the art that a number of other modifications exist which do not deviate from the scope of the present invention as defined by the appended claims.

What is claimed:

1. A computer implemented method of coding digital multimedia data, including a plurality of fixed-length data segments, as channel blocks, comprising the steps of:
 a) ordering the plurality of fixed-length data segments;
 b) selecting a first predetermined number of consecutive fixed-length data segments of the plurality of ordered fixed-length date segments to form a first channel block of digital multimedia data;
 c) arranging the ordered fixed-length data segments selected for the first channel block in step (b) as a pre-interleaved matrix including a plurality of rows and a plurality of columns, each column of the matrix containing a second predetermined number of consecutive ordered fixed-length data segments;
 d) determining forward error correction (FEC) data for each row of the first channel block and adding the determined FEC data to the matrix of the first channel block to form an augmented first channel block; and
 e) separating the augmented first channel block into a plurality of error resilient packets.

2. The computer implemented method of claim 1, wherein:
 step (a) includes the steps of;
  a1) determining a priority for each fixed-length data segment based on predetermined criteria; and
  a2) ordering the plurality of fixed-length data segments from a highest priority to a lowest priority; and
 step (d) includes the step of determining the FEC responsive to the priorities of the fixed-length data segments in the channel block.

3. The computer implemented method of claim 2, wherein the predetermined criteria for determining the priority of a fixed-length data segment include ease of performing error concealment if the fixed-length data segment is lost.

4. The computer implemented method of claim 2, wherein:
 the fixed-length data segments include a plurality of discrete cosine transform coefficients; and
 the predetermined criteria for determining the priority of a fixed-length data segment include a predetermined function of the discrete cosine transform coefficients of the fixed-length data segment.

5. The computer implemented method of claim 2, wherein step (d) further includes the step of selecting an FEC formula from a plurality of FEC formulae for the first channel block based on the priorities of the fixed-length data segments selected in step (b).

6. The computer implemented method of claim 2, wherein step (d) further includes the step of selecting a number of bits of FEC data for each row of the first channel block based on the priorities of the fixed-length data segments selected in step (b).

7. The computer implemented method of claim 1, further comprising the step of:
 f) transmitting the separated packets of channel block data over a transmission channel having a channel quality;
 wherein step (d) further includes the step of selecting an FEC formula from a plurality of FEC formulae for the first channel block based on the channel quality of the transmission channel.

8. The computer implemented method of claim 1, further comprising the step of:
 f) transmitting the separated packets of channel block data over a transmission channel having a channel quality;
 wherein step (d) further includes the step of selecting a number of bits of FEC data for each row of the first channel block based on the channel quality of the transmission channel.

9. The computer implemented method of claim 1, wherein the first channel block further includes a row of first channel block header data.

10. A computer implemented method of coding digital multimedia data with forward error correction (FEC), using a plurality of FEC procedures, comprising the steps of:
 a) organizing the digital multimedia data in a plurality of channel blocks, each channel block including a plurality of columns of digital multimedia data;
 b) determining a priority of each channel block based on the digital multimedia data within the channel block using predetermine criteria;
 c) selecting one FEC procedure of the plurality of FEC procedures for a channel block based on the priority of the channel block determined in step (b);
 d) using the selected FEC procedure to determine FEC data for the channel block;
 e) adding the determined FEC data to the channel block to form an augmented channel block; and
 f) separating the augmented channel block into a plurality of error resilient packets.

11. The computer implemented method of claim 10, wherein the predetermined criteria includes ease of performing error concealment if a packet is lost during transmission.

12. The computer implemented method of claim 10, wherein:
 the digital multimedia data within the channel block includes a plurality of discrete cosine transform coefficients; and
 the predetermined criteria for determining the priority of the channel block include a predetermined function of the discrete cosine transform coefficients of the digital multimedia data within the channel block.

13. The computer implemented method of claim 10, wherein the plurality of FEC procedures determine FEC data with one predetermined bit-length, and the plurality of FEC procedures correspond to a plurality of FEC formulae.

14. The computer implemented method of claim 10, wherein the plurality of FEC procedures use one FEC formula and the plurality of FEC procedures correspond to FEC data with a plurality of bit-lengths.

15. The computer implemented method of claim 10, wherein step (e) further includes the step of adding information of the FEC procedure selected in step (c) to the channel block.

16. A method of transmitting digital multimedia data using a plurality of transmission channels, comprising the steps of:
   a) organizing the digital multimedia data in a plurality of channel blocks, each channel block including a plurality of columns of digital multimedia data;
   b) determining a priority of a channel block based on the digital multimedia data within the channel block based on predetermined criteria;
   c) selecting one transmission channel of the plurality of transmission channels for the channel block based on the priority of the channel black determined in step (b); and
   d) transmitting the channel block as a plurality of packets on the transmission channel selected in step (c).

17. The method of claim 16, wherein step (a) further includes the steps of:
   a1) determining FEC data for the channel block based on the digital multimedia data within the channel block; and
   a2) adding the determined FEC data as at least one additional column of the channel block.

18. The method of claim 16, wherein the predetermined criteria includes ease of performing error concealment if a packet is lost during transmission.

19. The method of claim 16, wherein:
   the digital multimedia data within the channel block includes a plurality of discrete cosine transform coefficients; and
   the predetermined criteria for determining the priority of the channel block include a predetermined function of the discrete cosine transform coefficients of the digital multimedia data within the channel block.

20. An error-resilient digital multimedia coding apparatus, comprising:
   a block farming buffer to organize digital multimedia data in a plurality of channel blocks which include a plurality of columns of digital multimedia data;
   prioritizing means to determine a priority of a channel block based on the digital multimedia data within the channel block; and
   a plurality of calculating means to determine forward error correction (FEC) data for the channel block; and
   selection means to select one calculating means of the plurality of calculating means for the channel block based on the priority of the channel block;
   wherein the block forming buffer includes corresponding FEC data within the channel blocks.

21. The method of claim 20, further comprising packetization buffers to separate the channel black into a plurality of packets, each packet including a column of the channel block.

22. An error-resilient digital multimedia transmission apparatus, comprising:
   a digital multimedia coding section which includes:
      a block forming buffer to organize digital multimedia data into a plurality of channel blocks which include a plurality of columns of digital multimedia data; and
      prioritizing means to determine a priority of a channel block based on the digital multimedia data within the channel block; and
   a plurality of transmission channels;
   wherein one transmission channel from the plurality of transmission channels for use with each one channel block is selected based on the priority of the one channel block.

23. The method of claim 22, further comprising packetization buffers to separate the channel block into a plurality of packets, each packet including a column of the channel block.

24. The method of claim 22, wherein:
   the digital multimedia coding section further includes calculating means to determine forward error correction (FEC) data for the channel block; and
   the block forming buffer includes at least one column for the FEC data.

25. An error-resilient digital multimedia storage system, comprising:
   a digital multimedia coding section which includes:
      a block forming buffer to organize digital multimedia data into a plurality of channel blocks which include a plurality of columns of digital multimedia data; and
      prioritizing means to determine a priority of a channel block based on the digital multimedia data within the channel block; and
   a plurality of storage elements;
   wherein a storage element from the plurality of storage elements for use with each one channel block is selected based on the priority of the one channel block.

26. The method of claim 25, further comprising packetization buffers to separate the channel block into a plurality of packets, each packet corresponding to a column of the channel block.

27. The method of claim 25, wherein:
   the digital multimedia coding section further includes calculating means to determine forward error correction (FEC) data for the channel block; and
   the block forming buffer includes at least one column for the FEC data.

28. A computer implemented method of coding digital video (DV) data, including a plurality of DV segments, as channel blocks, comprising the steps of:
   a) ordering the plurality of DV segments;
   b) selecting a first predetermined number of consecutive DV segments of the plurality of ordered DV segments to form a first channel block of DV data;
   c arranging the ordered DV segments selected for the first channel block in step b) as a pre-interleaved matrix including a plurality of rows and a plurality of columns, each column of the matrix containing a second predetermined number of consecutive ordered DV segments;
   d) determining forward error correction (FEC) data for each row of the first channel block and adding the determined FEC data to the matrix of the first channel block to form augmented first channel block; and
   e) separating the augmented first channel block into a plurality of error resilient, packets.

29. A computer implemented method of coding digital video (DV) data as channel blocks, comprising the steps of:

a) organizing the DV data in a plurality of channel blocks, each channel block including a plurality of columns of DV data;
b) determining a priority of each channel block based on DV data within the channel block using predetermine criteria;
c) selecting one FEC procedure of the plurality of FEC procedures for a channel block based on the priority of the channel block determined in step (b);
d) using the selected FEC procedure to determine FEC data for the channel block;
e) adding the determined FEC data to the channel block to form an augmented channel block; and
f) separating the augmented channel block into a plurality of error resilient packets.

30. A method of transmitting digital video (DV) data using a plurality of transmission channels, comprising the steps of:
a) organizing the DV data in a plurality of channel blocks, each channel block including a plurality of columns of DV data;
b) determining a priority of a channel block based on the DV data within the channel block based on predetermined criteria;
c) selecting one transmission channel of the plurality of transmission channels for the channel block based on the priority of the channel block determined in step (b); and
d) transmitting the channel block as a plurality of packets on the transmission channel selected in step (c).

31. A computer readable medium including computer program instructions adapted to instruct a general purpose computer to perform a method which codes digital multimedia data, including a plurality of fixed-length data segments, as channel blocks, the method comprising the steps of:
a) ordering the plurality of digital multimedia data segments;
b) selecting a first predetermined number of consecutive fixed-length data segments of the plurality of ordered fixed-length data segments to form a first channel block of video data;
c) arranging the ordered fixed-length data segments selected far the first channel block in step (b) as a pre-interleaved matrix including a plurality of rows and a plurality of columns, each column of the matrix containing a second predetermined number of consecutive ordered fixed-length data segments;
d) determining forward error correction (FEC) data for each row of the first channel block and adding the determined FEC data to the matrix of the first channel block; and
e) separating the first channel block into a plurality of packets.

32. A computer readable medium including computer program instructions adapted to instruct a general purpose computer to perform a method codes digital multimedia data as channel blocks, the method comprising the steps of:
a) organizing the digital multimedia data in a plurality of channel blocks, each channel block including a plurality of columns of digital multimedia data;
b) determining a priority of each channel block based on the digital multimedia data within the channel block using predetermine criteria;
c) selecting one FEC procedure of the plurality of FEC procedures for a channel block based on the priority of the channel block determined in step (b);
d) using the selected FEC procedure to determine FEC data for the channel block;
e) adding the determined FEC data to the channel block; and
f) separating the channel block into a plurality of packets.

* * * * *